US009620225B2

(12) United States Patent
Ashokkumar et al.

(10) Patent No.: US 9,620,225 B2
(45) Date of Patent: Apr. 11, 2017

(54) SPLIT VOLTAGE NON-VOLATILE LATCH CELL

(71) Applicant: Cypress Semiconductor Corporation, San Jose, CA (US)

(72) Inventors: Jayant Ashokkumar, Colorado Springs, CO (US); Vijay Raghavan, Colorado Springs, CO (US); Venkatraman Prabhakar, Pleasanton, CA (US); Swatilekha Saha, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/858,813

(22) Filed: Sep. 18, 2015

(65) Prior Publication Data

US 2016/0217861 A1 Jul. 28, 2016

Related U.S. Application Data

(60) Provisional application No. 62/107,173, filed on Jan. 23, 2015, provisional application No. 62/120,184, filed on Feb. 24, 2015.

(51) Int. Cl.
*G11C 14/00* (2006.01)
*G11C 16/14* (2006.01)
(Continued)

(52) U.S. Cl.
CPC .......... *G11C 16/14* (2013.01); *G11C 11/2275* (2013.01); *G11C 14/00* (2013.01);
(Continued)

(58) Field of Classification Search
CPC ..... G11C 16/14; G11C 11/2275; G11C 14/00; G11C 16/0408; G11C 16/0466; G11C 16/0483
(Continued)

(56) References Cited

U.S. PATENT DOCUMENTS 5,781,471 A 7/1998 Kowshik et al.
6,172,907 B1 1/2001 Jenne
(Continued)

OTHER PUBLICATIONS

International Search Report for International Application No. PCT/US2016/013258 dated Mar. 25, 2016; 4 pages.
(Continued)

*Primary Examiner* — Richard Elms
*Assistant Examiner* — Xiaochun L Chen (57) ABSTRACT

A memory including an array of non-volatile latch (NVL) cells and method of operating the same are provided. In one embodiment, each NVL cell includes a non-volatile portion and a volatile portion. The non-volatile portion includes a first non-volatile memory (NVM) device and a first pass gate transistor coupled in series between a first output node and a bitline true, and a second NVM device and a second pass gate transistor coupled in series between a second output node and a bitline complement. The volatile portion includes cross-coupled first and second field effect transistors (FET), the first FET coupled between a supply voltage (VPWR) and the first output node, and the second FET coupled between VPWR and the second output node. A gate of the first FET is coupled to the second output node, and a gate of the second FET is coupled to the first output node.

20 Claims, 9 Drawing Sheets

(51) Int. Cl.
*G11C 16/04* (2006.01)
*G11C 11/22* (2006.01)

(52) U.S. Cl.
CPC ...... *G11C 14/0063* (2013.01); *G11C 14/0072* (2013.01); *G11C 16/0408* (2013.01); *G11C 16/0466* (2013.01); *G11C 16/0483* (2013.01)

(58) Field of Classification Search
USPC .................................................. 365/185.08
See application file for complete search history.

(56) References Cited

U.S. PATENT DOCUMENTS

| | | | | |
|---|---|---|---|---|
| 6,556,487 | B1* | 4/2003 | Ratnakumar | G11C 14/00 |
| | | | | 365/154 |
| 7,054,194 | B2 | 5/2006 | Liaw et al. | |
| 7,164,608 | B2* | 1/2007 | Lee | G11C 14/00 |
| | | | | 365/189.05 |
| 7,336,534 | B2 | 2/2008 | Jung | |
| 8,331,134 | B2* | 12/2012 | Chiu | G11C 13/0002 |
| | | | | 365/154 |
| 8,947,122 | B2* | 2/2015 | Prabhakar | H03K 19/0944 |
| | | | | 326/46 |
| 9,013,927 | B1 | 4/2015 | Cunningham et al. | |
| 9,019,764 | B2 | 4/2015 | Lee et al. | |
| 2005/0141266 | A1 | 6/2005 | Jung | |
| 2006/0023503 | A1* | 2/2006 | Lee | G11C 14/00 |
| | | | | 365/185.05 |
| 2011/0280073 | A1* | 11/2011 | Chiu | G11C 13/0002 |
| | | | | 365/185.08 |
| 2014/0197864 | A1* | 7/2014 | Prabhakar | H03K 19/0944 |
| | | | | 326/46 |

OTHER PUBLICATIONS

Written Opinion of the International Searching Authority for International Application No. PCT/US2016/013258 mailed Mar. 25, 2016; 7 pages.
"Multi-level vertical channel SONOS nonvolatile memory on SOI," copyright 2002, downloaded from http://ieeexpore.ieee.org/xpl/freeabs_all.jsp?arnumber=1015455 on Aug. 11, 2011, Lee, et al., pp. 208-209; 2 pages.
Research Gate, "Controlling injected electron and hole profiles for better reliability of split gate SONOS", Aug. 5, 2015; 6 pages.

* cited by examiner

SPLIT VOLTAGE NON-VOLATILE LATCH CELL

CROSS-REFERENCE TO RELATED APPLICATIONS

This application claims the benefit of priority under 35 U.S.C. 119(e) to U.S. Provisional Patent Application Ser. No. 62/107,173, filed Jan. 23, 2015, and 62/120,184, filed Feb. 24, 2015, both of which are incorporated by reference herein in its entirety.

TECHNICAL FIELD

This disclosure relates generally to semiconductor memories and more particularly to a memory including Non-Volatile Latch cells and methods of operating the same.

BACKGROUND

A non-volatile latch (NVL) is a type of semiconductor memory that uses bistable, cross-coupled floating gate or silicon-oxide-nitride-oxide-silicon (SONOS) memory transistors provided to store each bit of data. Typically, NVL cells are very large, exceeding about 100 µm² using current semiconductor technology, and require high-voltages and complicated signals to power-up correctly. In addition, the architecture of a conventional NVL cell can provide indeterminate data on first power up, and the memory transistors are prone to the well-known read-disturb phenomenon by which repeated read operations can degrade the stored data.

Thus, there is a need for a non-volatile latch which overcomes the shortcomings of the conventional NVL cell architecture.

SUMMARY

A memory including an array of non-volatile latch (NVL) cells having fewer transistors and smaller area, and methods of operating the same are provided. Generally, each NVL cell includes a non-volatile portion and a volatile portion. The non-volatile portion includes a series connected first non-volatile memory (NVM) device and a first pass gate transistor coupled between a first output node and a bitline true, and a series connected second NVM device and a second pass gate transistor coupled between a second output node and a bitline complement. The volatile portion includes cross-coupled first and second field effect transistors (FET), the first FET coupled between a supply voltage (VPWR) and the first output node, and the second FET coupled between VPWR and the second output node. A gate of the first FET is coupled to the second output node, and a gate of the second FET is coupled to the first output node.

In one embodiment, each of the first memory device and second memory device are in a triple well, and gates of the first and second NVM devices and the triple wells are biased separately from a negative voltage source (VNEG) and a positive voltage source (VPOS) during erase and program operations to enable split voltage operation to program and erase the first and second NVM devices.

BRIEF DESCRIPTION OF THE DRAWINGS

Embodiments of the present invention will be understood more fully from the detailed description that follows and from the accompanying drawings and the appended claims provided below, where:

DETAILED DESCRIPTION

The present disclosure is directed generally to semiconductor memories and more particularly to a memory including Non-Volatile Latch (NVL) cells and method of operating the same.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term to couple as used herein may include both to directly electrically connect two or more components or elements and to indirectly connect through one or more intervening components.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

Figure 1:
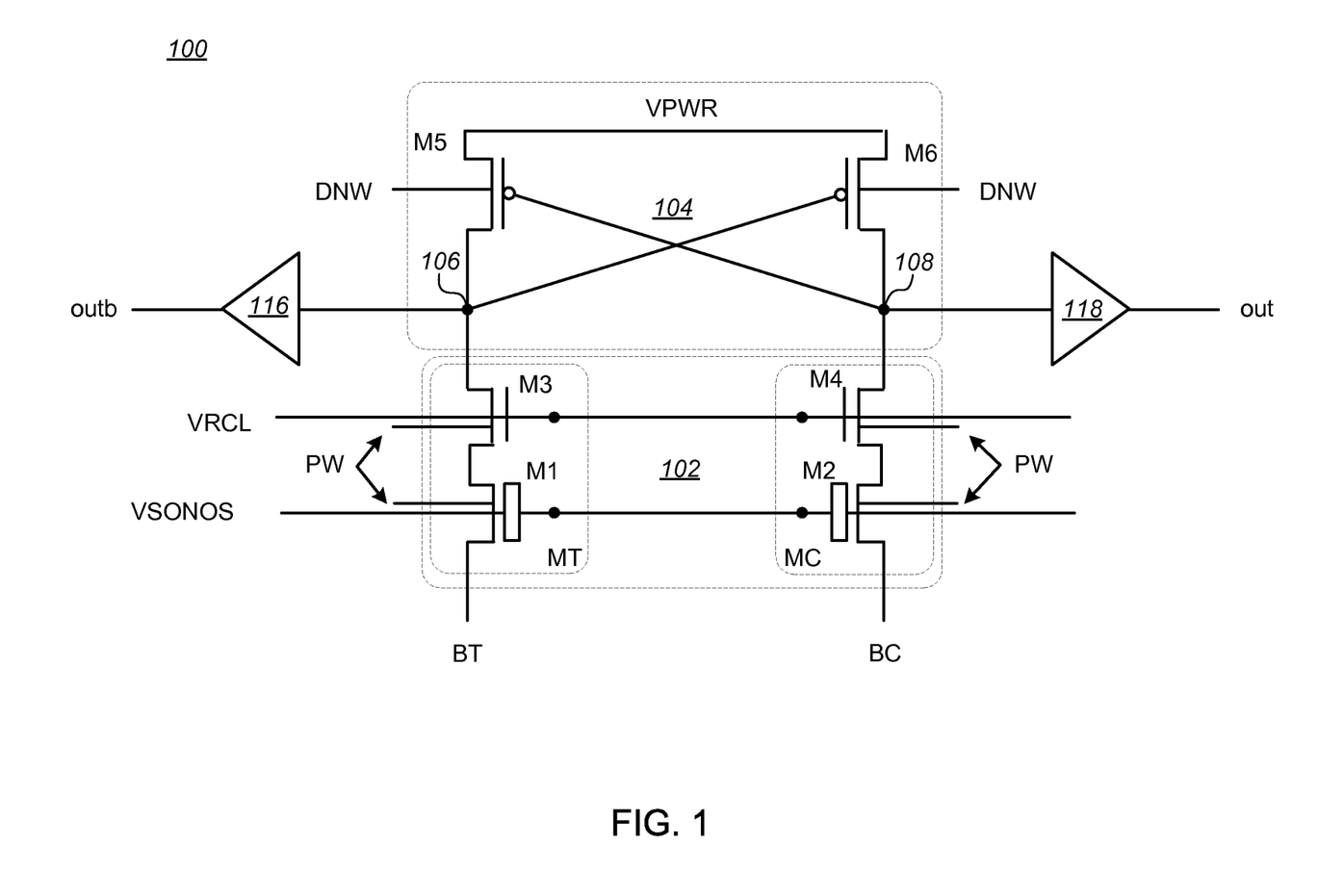
FIG. 1 is a schematic diagram of a split voltage non-volatile latch (NVL) cell according to an embodiment of the present disclosure.

FIG. 1 is a schematic diagram of a split voltage NVL cell according to one embodiment of the present disclosure. Referring to FIG. 1, the NVL cell 100 is a differential cell and includes a non-volatile portion 102, and a volatile portion 104 or latch portion that is set based on data read from the non-volatile portion 102 upon power up of the cell. The non-volatile portion 102 includes two sets (MT and MC) of series connected non-volatile memory (NVM) devices and pass gate transistors. In the embodiment shown, the first set of series connected NVM devices, MT, consists of a first NVM device M1 and a first pass gate transistor M3 coupled between a first output node 106 and a bitline true BT. The second set of series connected NVM devices, MC, consists of a second NVM device M2 and a second pass gate transistor M4 coupled between a second output node 108 and a bitline complement BC. The first and second NVM devices M1, M2, may include NVM devices or transistors implemented using Silicon-Oxide-Nitride-Oxide-Silicon (SONOS), floating-gate MOS field-effect transistor (FG-MOS), or ferroelectric random access memory (FeRAM) technology.

The volatile portion 104 consists of cross-coupled first and second field effect transistors (FET), including a first FET M5 coupled between a supply voltage (VPWR) and the first output node 106, and a second FET M6 coupled between VPWR and the second output node 108. By cross-coupled it is meant that a gate terminal of the first FET M5 is coupled to the second output node 108 and through the second output node to a source or drain terminal of the second FET M6, and a gate terminal of the second FET M6 is coupled to the first output node 106 and to a source or drain terminal of the first FET M5. The first and second FETs M5, M6, include channels of a different or opposite type, i.e., with a P or N type dopant, from the first and second pass gate transistors M3, M4 and the first and second NVM devices M1, M2, which generally include channels of the same dopant type. For example, in the embodiment shown in FIG. 1 and described herein the first and second FETs M5, M6, are P-channel metal-oxide-semiconductor (PMOS) FETs, while the first and second pass gate transistors M3, M4, are N-channel metal-oxide-semiconductor (NMOS) FETs, and the first and second NVM devices M1, M2, are N-channel NVM transistors such as NSONOS N-type FGMOS transistors.

In certain embodiments, the first and second FETs are weak PMOS transistors having high threshold voltages higher than the threshold voltages of the first and second pass gate transistors so that the NVM devices of the non-volatile portion 102 can pull down on the first and second output nodes 106, 108, of the latch portion. For example, the first and second FETs can include PMOS transistors having high threshold voltages of about 0.75V and a drain saturation current (Idsat) of about 10 µA for an applied voltage of about 1.2V. Such high threshold voltages can be achieved by providing the weak PMOS transistors with thick gate oxides of from about 25 to about 33 nanometers (nm).

The NVL cell 100 is placed or formed in a triple well structure (not shown in FIG. 1) in which the first and second FETs M5, M6, are in a deep Nwell in a P-substrate, and the first and second pass gate transistors M3, M4 and the first and second NVM devices M1, M2, are formed in a Pwell inside the deep Nwell, so that during program and erase operations a total high voltage applied across the NVM devices can be split between gates of the NVM devices and the Pwell in which the NVM device is placed or formed. An embodiment of one such triple well structure is shown in FIG. 2.

Figure 2:
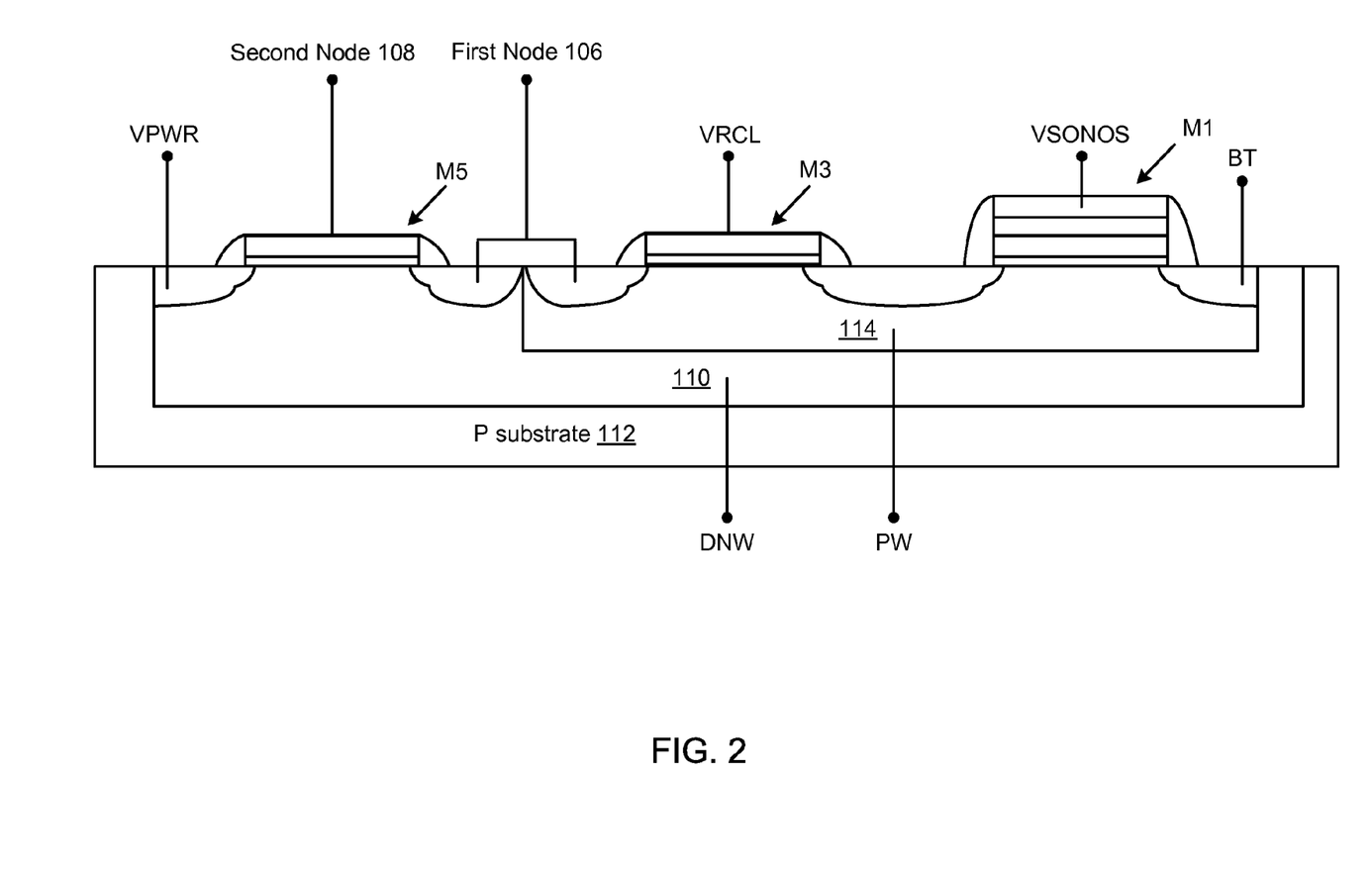
FIG. 2 is a block diagram of a cross-sectional view of a portion of the NVL cell of FIG. 1 illustrating a triple well structure according to an embodiment of the present disclosure.

FIG. 2 is a block diagram of a cross-sectional view of a portion of the NVL cell 100 of FIG. 1 showing NVM device M1, pass gate transistor M3 and first FET M5. Referring to FIG. 2 it is noted that in an embodiment in which the first FET M5 is a PMOS FET, it is formed or placed in a deep Nwell 110 in a P-substrate 112, and the first pass gate transistor M3 and the first NVM device M1 are in a Pwell 114 in the deep Nwell. The deep Nwell is biased through a deep Nwell terminal (DNW) while the Pwell is biased through a Pwell terminal (PW) as show in this figure and in FIG. 1. While not shown it will be understood that the second FET M6 is also formed or placed in the deep Nwell 110 in the P-substrate 112, and the second pass gate transistor M4 and the second NVM device M2 are in a Pwell in the deep Nwell. It will also be understood that the Pwell in which the second pass gate transistor M4 and the second NVM device M2 are placed or formed can be the same Pwell 114 as shown in FIG. 2, or in a separate Pwell in the deep Nwell.

Referring again to FIG. 1, the NVL cell may further include a first output buffer 116 coupled to the first output node 106 to provide a first data output (outb), and a second output buffer 118 coupled to the second output node 108 to provide a second data output (out) of which the first output is a complement. The first and second output buffers 116, 118, can include either high voltage (HV) or low voltage (LV) output buffers. However, as explained in greater detail below, the output nodes 106, 108, of the NVL cell 100 are isolated from high voltages in the NVM portion 102 during program and erase (P/E) operations. The output nodes are at a low voltage and therefore can interface directly with LV devices in a memory incorporating NVL cells 100 of the present disclosure with or without an LV buffer.

It will be evident, however, to those skilled in the art that the above NVL cell 100 requires substantially fewer transistors or devices as compared to the prior art. Conventional NVL cells typically require eighteen or more transistors per NVL cell as compared to the six in the NVL cells 100 of the present disclosure. Therefore, the area per NVL cell is substantially smaller—less than about 3 µm² compared to about 125 µm², thus enabling smaller semiconductor memories or higher density memories. Moreover, because only a single N-type or P-type of NVM devices M1, M2 are used in each cell, fewer masks are needed to fabricate the NVL cells of the present disclosure, as compared to the prior art, lowering costs and fabrication time while also increasing the yield of working memories.

Figure 3:
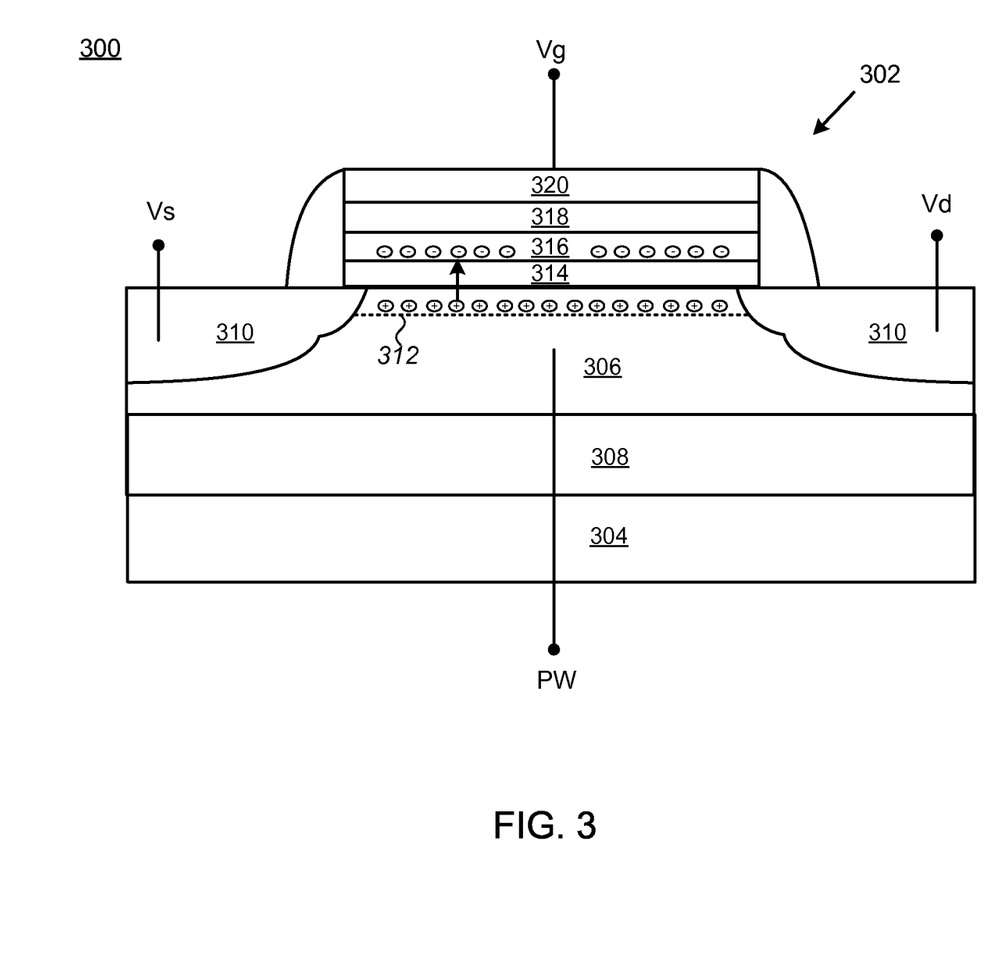
FIG. 3 is a block diagram illustrating an erase operation for a SONOS device in a split voltage NVL cell according to an embodiment of the present disclosure.

An erase operation for an NVM device or transistor implemented using SONOS technology will now be described with reference to FIG. 3. FIG. 3 is a block diagram of a cross-sectional view of an embodiment of an N-channel SONOS device or transistor suitable for use in the NVL cell of the present disclosure. Referring to FIG. 3 SONOS device 300 includes a gate stack 302 formed over a substrate 304. In the embodiment shown, the SONOS device 300 is formed in a first well (Pwell 306) and formed in a second deep well (deep Nwell 308) in a P type substrate 304 as described above. SONOS device 300 further includes source/drain regions 310 formed in Pwell 306 on either side of gate stack 302, which define a channel region 312 underneath gate stack. Gate stack 302 includes an oxide tunnel dielectric layer 314, one or more nitride or oxynitride charge-trapping layers 316, a top, blocking oxide layer 318 and a poly-silicon (poly) or metal layer which serves as a control gate or gate 320.

When a negative bias is applied to the gate 320 relative to the substrate or Pwell 306, holes or a positive charge accumulated in the channel region 312 are injected or tunnel through tunnel dielectric layer 314 and are trapped in the charge-trapping layers 316. The mechanisms by which charge is injected can include both Fowler-Nordheim (FN) tunneling and hot-carrier injection. The charge trapped in the charge-trapping layer 316, reduces the threshold voltage ($V_T$) necessary to turn on the device 300, lowering an energy barrier between the drain and the source, and putting the device in an "erased" or zero data state. An erased NSONOS transistor having an erased threshold voltage ($V_{TE}$) has a relatively high drain-to-source current (Ids) in the tens of microampere (μA) range with an applied gate-to-source voltage (Vgs) of about 0V.

In another embodiment, the NVM device can be a floating-gate MOS field-effect transistor (FGMOS) or device. Generally, FGMOS is similar in structure to the SONOS device 300 described above, differing primarily in that a FGMOS includes a poly-silicon (poly) floating gate, which is capacitively coupled to a control gate of the device, rather than a nitride or oxynitride charge-trapping layers 316. Similar to the SONOS device 300 described above the FGMOS device can be erased by applying an appropriate bias between the control gate and the Pwell terminal (PW) to inject a positive charge (holes) on to the floating gate, lowering the threshold voltage $V_T$ necessary to turn on the FGMOS device.

In yet another embodiment, the NVM device can be a FeRAM transistor or device. FeRAM is a non-volatile random-access memory technology similar in construction to flash memory, such as DRAM, but uses a ferroelectric layer instead of a dielectric layer to achieve non-volatility. FeRAM is operated similar to flash memory. Erasing is accomplished by applying a field across the ferroelectric layer by charging the plates on either side of it, forcing the atoms inside into the "up" or "down" orientation (depending on the polarity of the charge), thereby storing a "1" or "0".

Figure 4:
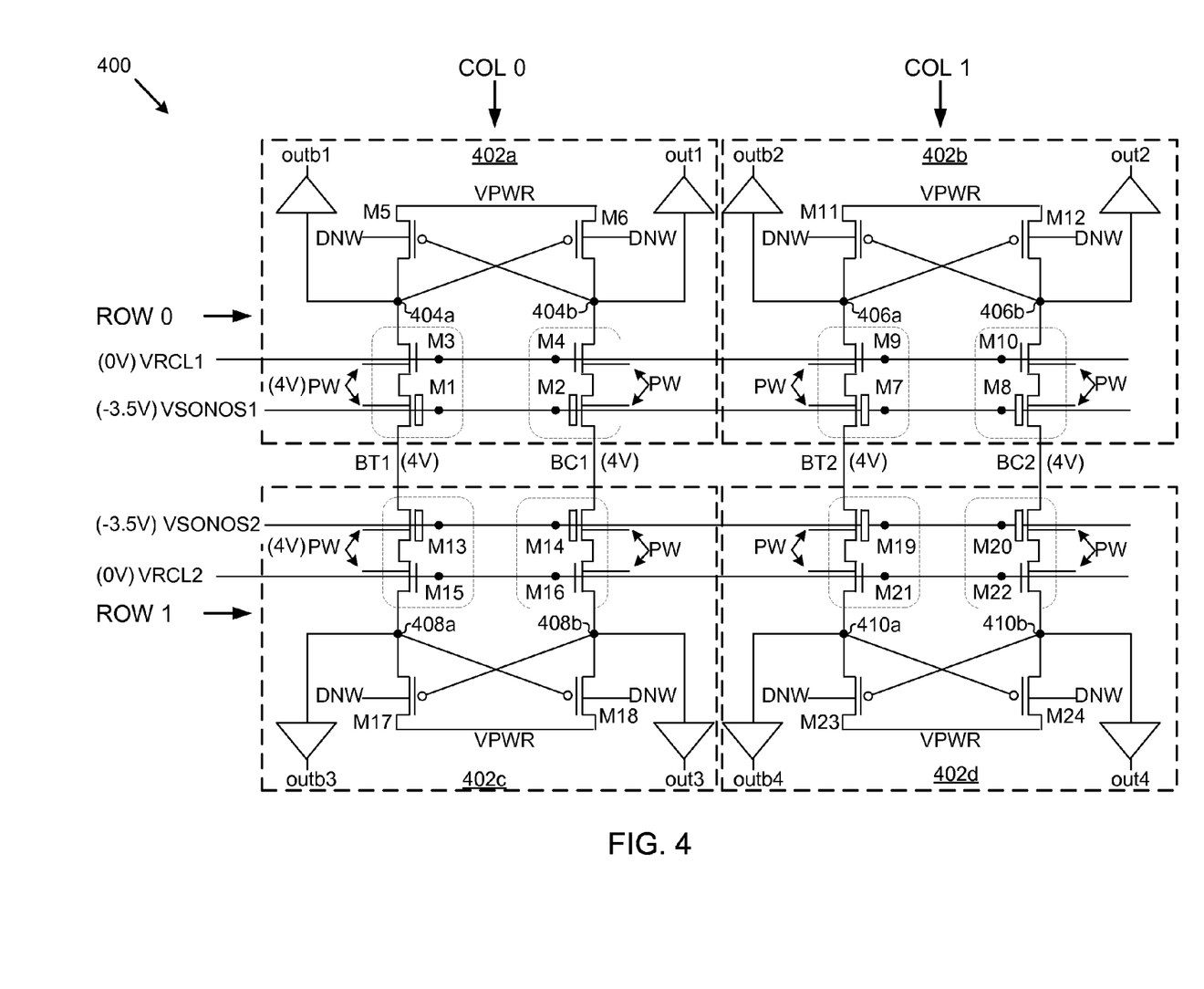
FIG. 4 is a schematic diagram of a 2×2 NVL array illustrating the bias conditions used for an erase operation according to an embodiment of the present disclosure.

An erase operation for an NVL array including NVL cells according to an embodiment of the present disclosure now will be described with reference to FIG. 4. FIG. 4 is a schematic diagram of a two row by two column (2×2) portion of an NVL array illustrating the bias conditions used for an erase operation on the 2×2 NVL array. Referring to FIG. 4, the 2×2 NVL array 400 includes four NVL cells, including a first NVL cell 402a in a first column (COL. 0) and a first row (ROW. 0), a second NVL cell 402b in a second column (COL. 1) and the first row (ROW. 0), a third NVL cell 402c in the first column (COL. 0) and a second row (ROW. 1), and a fourth NVL cell 402d in the second column (COL. 1) and the second row (ROW. 1). As with the NVL cell 100 described above with reference to FIG. 1, each NVL cell 402a-d is a differential cell and including a non-volatile portion having two sets of series NVM devices and pass gate transistors, and a volatile portion or latch portion consisting of cross-coupled first and second FETs coupled between VPWR and first and second output nodes. The latch is set based on data read from the non-volatile portion upon power up. In the embodiment shown, each cell further includes first and second output buffers coupled to first and second nodes respectively.

In particular, NVL cell 402a includes first and second NVM devices M1, M2, and first and second pass gate transistors M3, M4. First NVM device M1 and first pass gate transistor M3 are coupled in series between a first node 404a and a bitline true (BT1). Second NVM device M2 and second pass gate transistor M4 are coupled in series between a second node 404b and a bitline complement (BC1). The gates of the first and second NVM devices M1, M2, are coupled to a wordline or program/erase line (VSONOS1), and the gates of the first and second pass gate transistors M3, M4, are coupled to a recall line (VRCL1). The volatile portion includes cross-coupled first and second FETs M5, M6, coupled between VPWR and first and second output nodes 404a, 404b, with first FET M5 having a gate coupled to the second output node 404b, and second FET M6 having a gate coupled to the first output node 404a.

The second NVL cell 402b in the first row (ROW.0) and second column (COL.1) includes first and second NVM devices M7, M8, and first and second pass gate transistors M9, M10. First NVM device M7 and first pass gate transistor M9 are coupled in series between a first node 406a and a bitline true (BT2). Second NVM device M8 and second pass gate transistor M10 are coupled in series between a second node 406b and a bitline complement (BC2). The gates of the first and second NVM devices M7, M8, are coupled to VSONOS1, and the gates of the first and second pass gate transistors M9, M10, are coupled to VRCL1. The volatile portion includes cross-coupled first and second FETs M11, M12, coupled between VPWR and first and second output nodes 406a, 406b, with first FET M11 having a gate coupled to the second output node 406b, and second FET M12 having a gate coupled to the first output node 406a.

The third NVL cell 402c in the second row (ROW.1) and first column (COL. 0) includes first and second NVM devices M13, M14, and first and second pass gate transistors M15, M16. First NVM device M13 and first pass gate transistor M15 are coupled in series between a first node 408a and a bitline true (BT1). Second NVM device M14 and second pass gate transistor M16 are coupled in series between a second node 408b and a bitline complement (BC1). The gates of the first and second NVM devices M13, M14, are coupled to a program/erase line (VSONOS2), and the gates of the first and second pass gate transistors M15, M16, are coupled to a recall line (VRCL2). The volatile portion includes cross-coupled first and second FETs M17, M18, coupled between VPWR and first and second output nodes 408a, 408b, with first FET M17 having a gate coupled to the second output node 408b, and second FET M18 having a gate coupled to the first output node 408a.

Finally, the fourth NVL cell 402d in the second row (ROW.1) and second column (COL. 1) includes first and second NVM devices M19, M20, and first and second pass gate transistors M21, M22. First NVM device M19 and first pass gate transistor M21 are coupled in series between a first node 410a and a bitline true (BT2). Second NVM device M20 and second pass gate transistor M22 are coupled in series between a second node 410b and a bitline complement (BC2). The gates of the first and second NVM devices M19, M20, are coupled to VSONOS2, and the gates of the first and second pass gate transistors M21, M22, are coupled to VRCL2. The volatile portion includes cross-coupled first and second FETs M23, M24, coupled between VPWR and first and second output nodes 410a, 410b, with first FET M23 having a gate coupled to the second output node 410b, and second FET M24 having a gate coupled to the first output node 410a.

Referring to FIG. 4, the erase operation uses a split voltage concept wherein the gates of the NVM devices M1, M2, M7, M8, M13, M14, M19, M20, coupled to VSONOS1 and VSONOS2 go to a negative value (VNEG) of −3.5V while the Pwells (PW) go to a positive value (VPOS) of 4V. Thus, the total voltage across the NVM devices is about 7.5V, which is sufficient to enable holes or a positive charge to tunnel or be injected from the substrate into a nitride charge trapping layer of the NVM devices. The pass transistors M3, M4, M9, M10, M15, M16, M21, M22, whose gates are connected to VRCL1 and VRCL2, are held at ground during an erase operation thus isolating the volatile latch from the non-volatile portion of the NVL cells 402a-d. Throughout the erase operation the true bitlines (BT1 and BT2) and complement bitlines (BC1 and BC2) and the deep Nwells (DNW) are held at VPOS or 4V. VPWR is from about 1.2V to about 3.6V.

Figure 5:
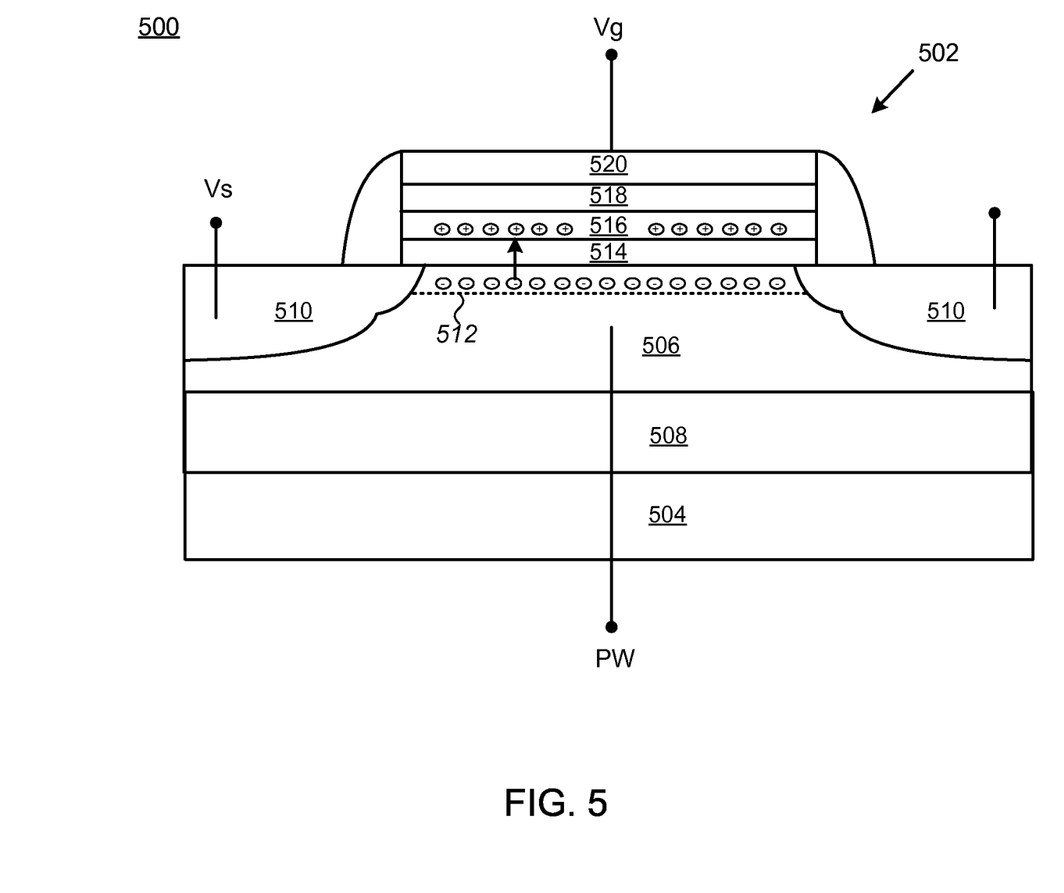
FIG. 5 is a block diagram illustrating a program operation for the SONOS device in the split voltage NVL cell according to an embodiment of the present disclosure.

A program operation for an NVM device or transistor implemented using SONOS technology will now be described with reference to FIG. 5. FIG. 5 is a block diagram of a cross-sectional view of an embodiment of an N-channel SONOS device or transistor suitable for use in the NVL cell of the present disclosure. The structure of the SONOS device is identical to that described in reference to the SONOS device 300 above. Referring to FIG. 5 SONOS device 500 includes a gate stack 502 formed over a substrate 504. In the embodiment shown, the SONOS device 500 is formed in a first well (Pwell 506) formed in a second deep well (deep Nwell 508) in a P type substrate 504 as described above. SONOS device 500 further includes source/drain regions 510 formed in Pwell 506 on either side of gate stack 502, which define a channel region 512 underneath gate stack. Gate stack 502 includes an oxide tunnel dielectric layer 514, one or more nitride or oxynitride charge-trapping layers 516, a top blocking oxide layer 518 and a poly-silicon (poly) or metal layer which serves as a control gate or gate 520.

When a positive bias is applied to the gate 520 relative to the substrate or Pwell 506, electrons or a negative charge accumulated in the channel region 512 are injected or tunnel through tunnel dielectric layer 514 and are trapped in the charge-trapping layers 516. The negative charge trapped in the charge-trapping layer 516, increases the threshold voltage ($V_T$) necessary to turn on the device 500, thus a programmed NSONOS transistor has a more positive programmed threshold voltage ($V_{TP}$), raising an energy barrier between the drain and the source, turning the transistor "off" and putting it in a programmed or one data state. A programmed NSONOS transistor has a low drain-to-source current (Ids) of nano-ampere (nA) range with an applied gate-to-source voltage (Vgs) of about 0V.

Figure 6:
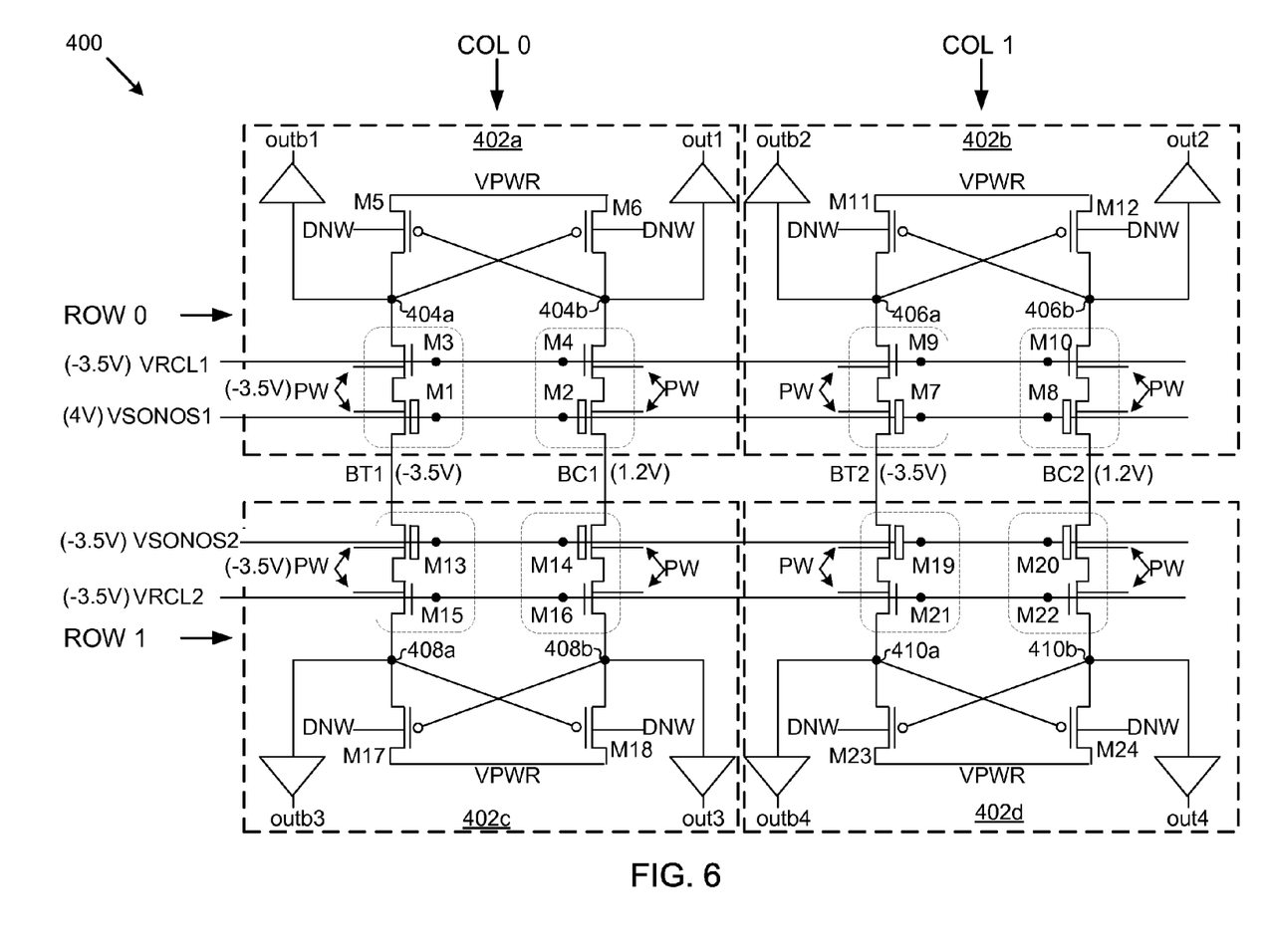
FIG. 6 is a schematic diagram of a 2×2 NVL array illustrating the bias conditions used for a program operation according to an embodiment of the present disclosure.

A program operation for an NVL array including NVL cells according to an embodiment of the present disclosure will now be described with reference to FIG. 6. FIG. 6 is a schematic diagram of a 2×2 portion of an NVL array illustrating the bias conditions used for a program operation on the 2×2 NVL array, and the structure of the array and the NVL cells in the array is identical to that described above with reference to FIG. 4. Referring to FIG. 6, the program operation uses a split voltage concept to program the selected NVM devices. In particular, throughout the program operation voltage on recall lines (VRCL1 and VRCL2) are held to −3.5V to isolate the volatile latch from the non-volatile portion of the NVL cells 402a-d; the program/erase line (VSONOS1) in the first row (ROW.0) coupled to the gates of NVM devices M1, M2, M7, M8, is held to VPOS (4V); the true bitlines (BT1 and BT2) coupled to NVM devices M1, M13, M7, M19, are held to VNEG (−3.5V); complement bitlines (BC1 and BC2) coupled to NVM devices M2, M14, M8, M20, are held to a static write inhibit voltage of about 1.2V; the Pwells are held to VNEG (−3.5V); and the deep Nwells (DNW) are held at VPOS or 4V. VPWR is from about 1.2V to about 3.6V.

With these bias conditions, the NVM devices M1 and M7 are programmed because the total voltage across VSONOS1 to BT1/BT2 is about 7.5V, which is sufficient to enable electrons or a negative charge to tunnel or be injected from the substrate into a nitride charge trapping layer of the NVM devices. The voltage across VSONOS1 to BC1/BC2 is around 2.8V, i.e., 4V−1.2V=2.8V, which is not sufficient to enable electrons or a negative charge to tunnel or be injected from the substrate into a nitride charge trapping layer of the NVM devices, and thus NVM devices M2 and M8 which are connected to BC1/BC2 are program inhibited. For the second row (ROW.1), which is not being programmed in FIG. 6, VSONOS2 and VRCL2 are held to VNEG (−3.5V). Thus, none of the NVM devices M13, M14, M19, M20 in the un-selected row will be programmed. The pass transistors M3, M4, M9, M10, M15, M16, M21, M22, whose gates are connected to VRCL1 and VRCL2, are held at VNEG during the program operation thus isolating the volatile latch from the non-volatile portion of the NVL cells 402a-d.

Figure 7:
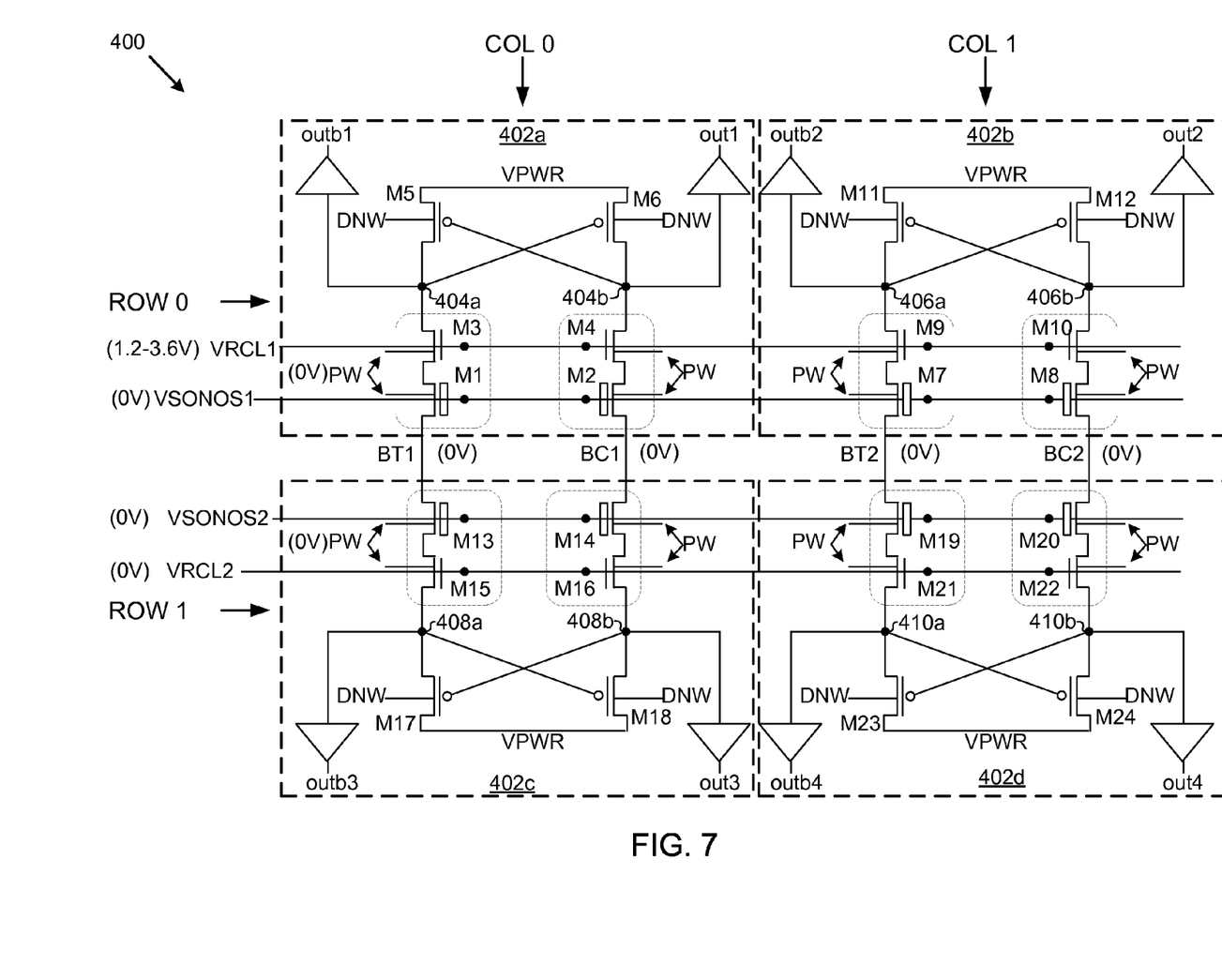
FIG. 7 is a schematic diagram of a 2×2 NVL array illustrating the bias conditions used for a recall or read operation according to an embodiment of the present disclosure.

A recall or read operation for an NVL array including NVL cells according to an embodiment of the present disclosure will now be described with reference to FIG. 7. FIG. 7 is a schematic diagram of a 2×2 portion of an NVL array illustrating the bias conditions used for a program operation on the 2×2 NVL array, and the structure of the array and the NVL cells in the array is identical to that described above with reference to FIG. 4. Referring to FIG. 7, in this mode the contents from the non-volatile portion are recalled into the volatile portion and latched. Erased NVM devices M2, M8 has an erased threshold voltage ($V_{TE}$) and are on. Thus, the second node 404b in NVL cell 402a discharges to bitline complement BC1, turns on first FET M5 and latches the data. Similarly, the second node 406b in NVL cell 402b discharges to bitline complement BC2, turning on first FET M11 and latching the data.

To recall data to the first row (ROW.0) in the NVL array in FIG. 7, true bitlines (BT1 and BT2), complement bitlines (BC1 and BC2) and VSONOS1 are held at 0V. Next, VRCL1 is held to VPWR (1.2V −3.6V). As the power (VPWR) supplied to the array from an external source slowly ramps up from a minimum operating voltage of 1.2V to 3.6V. As VPWR ramps up, both first output nodes 404a, 406a, and second output nodes 404b, 406b, ramp up also, but because the VSONOS1 is at VGND, the erased NVM devices M2, M8 are ON and conducting current and discharging second output nodes 404b, 406b to VGND which in turn ON the first FETs M5, M11 and put the output nodes 404a, 406a nodes to VPWR thus latching the recalled data from the non-volatile portion.

The programmed first NVM device M1 and first pass gate transistor M3, and first NVM device M7 and first pass gate transistor M9 in NVL cells 402a and 402b are OFF and no current flows through those series connections. Thus, the volatile data stays latched as long as power (VPWR) is ON or above the minimum operating voltage of 1.2V.

The same procedure may be followed to recall data for the second row (ROW.1). That is true bitlines (BT1 and BT2), complement bitlines (BC1 and BC2) and VSONOS2 are held at 0V. Next, VRCL2 is held to VPWR (1.2V−3.6V).

NVM Devices M1, M7, in the first row (ROW.0) can see a read disturb during a recall operation because both these NVM devices see an erase voltage of −3V between the gate (0V) and the drain coupled to the pass gate transistors M3, M9. This can limit the reliability of the NVM devices over time. To understand this a Time Dependent Dielectric Breakdown (TDDB) analysis was done by looking at data from actual NVL cells and the results are shown in FIGS. 8A and 8B.

Figure 8A:
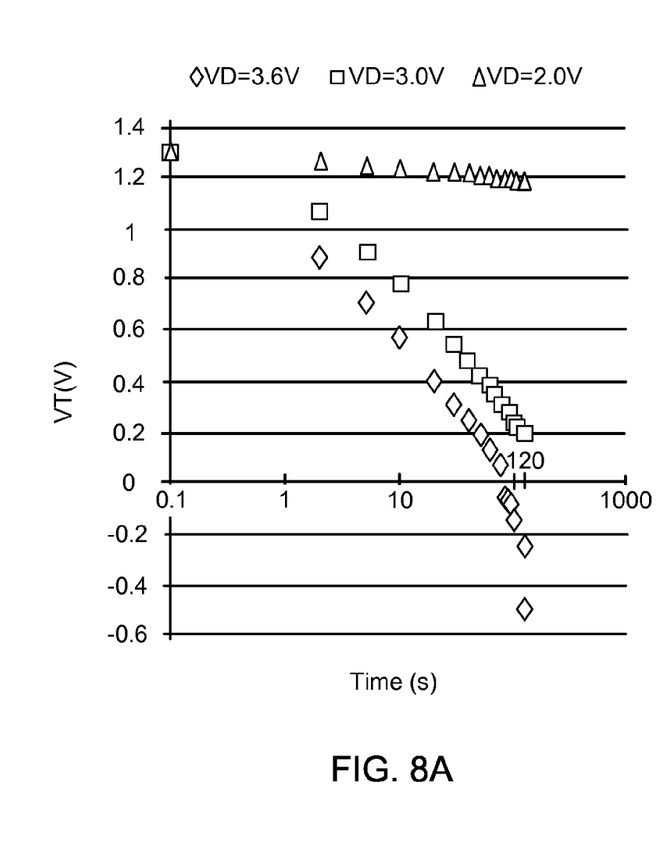
FIGS. 8A and 8B are plots illustrating effects of read stress on threshold voltages ($V_{TH}$) of SONOS devices in a split voltage NVL cell according to an embodiment of the present disclosure at different drain bias voltages.

FIG. 8A is a plot illustrating effects of read stress on threshold voltages ($V_{TH}$) of SONOS type NVM devices in a split voltage NVL cell for drain bias ($V_D$) of 3.6V, 3.0V and 2.0V for 120 seconds. Referring to FIG. 8A it is seen that, as expected, the NVL cell cannot survive a $V_D$ stress of 3.6V, exhibiting a drop in $V_{TH}$ of greater than 1.5V. It is further noted that a $V_D$ stress of 3.0V resulted in a drop in $V_{TH}$ from about 1.3V to about 0.2V in about 120 seconds.

Figure 8B:
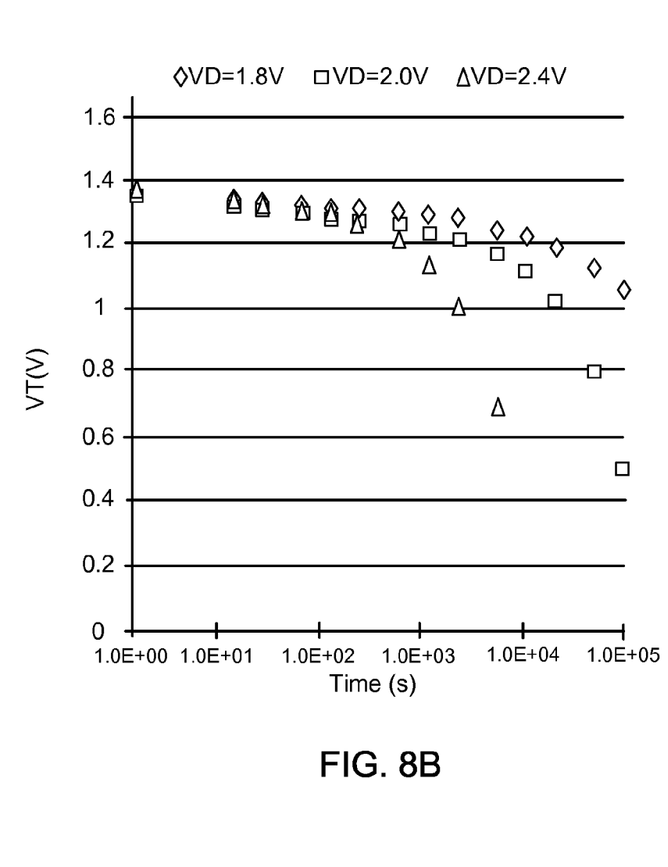

FIG. 8B is a plot illustrating effects of read stress on $V_{TH}$ of SONOS type NVM devices in a split voltage NVL cell for $V_D$ of 2.4V, 2.0V and 1.8V for a time in excess of 1.0E+05 seconds. Referring to FIG. 8B it is seen that for a $V_D$ of 1.8V the $V_{TH}$ of the NVM device degrades by less than about 0.4 to a $V_{TH}$ of greater than 1.0V in a time of about 1.0E+05 seconds or about 27 hours, which is acceptable. For drain bias of 2.4 V and 2.0 V, the $V_{TH}$ degradation is worse than 1.0V.

Because of this TDDB data, it is desirable in certain embodiments to restrict operation of the NVL cell to a maximum voltage of 1.8V, even though the external supply to the semiconductor memory can as high as 3.6V. Thus, in one embodiment a semiconductor memory including NVL cells according to the present disclosure, would further include an internally regulated supply voltage (VPWR) of 1.2V as soon as power up is finished so that the NVM devices will not see a high disturb voltage or $V_D$ exceeding 1.8V.

Figure 9:
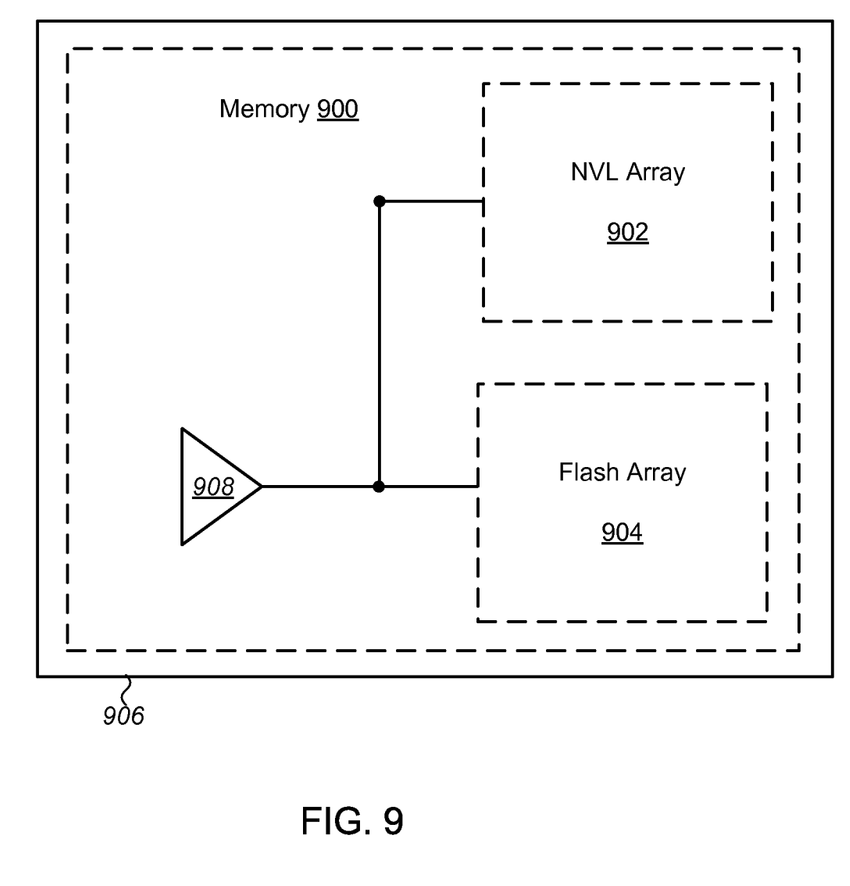
FIG. 9 is a block diagram of a semiconductor memory including a single charge pump integrally formed on a substrate with an array of flash cells, and an array of NVL cells according to an embodiment of the present disclosure.

In another embodiment, shown in FIG. 9, the array of NVL cells 902 can be part of a semiconductor memory 900 further including an array of flash cells 904 integrally formed on a common or shared substrate 906 with the array of NVL cells. In certain versions of this embodiment the semiconductor memory 900 may further include a single charge pump 908, also integrally formed on the same substrate 906 with the array of flash cells 904 and the array of NVL cells 902, and configured to be used to program and erase both the flash cells and the NVL cells, thus reducing the number of charge pumps need in the semiconductor memory 900, and further reducing the area needed for the memory. It will be understood that the ability to use a single charge pump 908 is made possible by the split-voltage architecture and method of operation, which enable the NVM devices in the NVL cells of the present disclosure to be programmed and erased with lower magnitudes of voltage, and by the output nodes 106, 108, of the NVL cell 100 are isolated from high voltages in the NVM portion 102 during program and erase.

Thus, embodiments of semiconductor memories including Non-Volatile Latch (NVL) cells and method of the same have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded as an illustrative rather than a restrictive sense.

The Abstract of the Disclosure is provided to comply with 37 C.F.R. §1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

What is claimed is:

1. A memory comprising:
   an array of non-volatile latch (NVL) cells, each NVL cell comprising:
   a non-volatile portion including:
   a first non-volatile memory (NVM) device and a first pass gate transistor coupled in series between a first output node and a bitline true; and
   a second NVM device and a second pass gate transistor coupled in series between a second output node and a bitline complement; and
   a volatile portion including cross-coupled first and second field effect transistors (FET), the first FET coupled between a supply voltage and the first output node, and the second FET coupled supply voltage and the second output node,
   wherein a gate of the first FET is coupled to the second output node and a gate of the second FET is coupled to the first output node,
   wherein the first FET and the second FET are in a same deep well of a first type disposed in a substrate of a second type,
   wherein each of the first NVM device and the second NVM device is in a well of the second type disposed in the deep well, and
   wherein the first and second pass gate transistors are respectively configured to isolate the first and second NVM devices from the first and second output nodes when a negative voltage is applied to gates of the first and second pass gate transistors.

2. The memory of claim 1, wherein each of the first NVM device and the second NVM device is in a triple well.

3. The memory of claim 2, wherein gates of the first and second NVM devices and the triple wells are biased separately from the negative voltage source (VNEG) and a positive voltage source (VPOS) during erase and program operations to enable split voltage operation to program and erase the first and second NVM devices.

4. The memory of claim 3, further comprising low voltage (LV) devices coupled to the first and second output nodes, wherein the first and second pass gate transistors are configured to isolate the volatile portion of the NVL cell from the split voltage used to erase and program the non-volatile portion during erase and program operations.

5. The memory of claim 3, further comprising high voltage (HV) buffers coupled to the first and second output nodes.

6. The memory of claim 1, wherein the first NVM device and the second NVM device comprise transistors having channels of the same type.

7. The memory of claim 6, wherein the first and second pass gate transistors comprise channels of the same type as the first and second NVM devices, and wherein the first and second FETs comprise channels of a different type from the first and second NVM devices.

8. The memory of claim 7, wherein the first FET and the second FET are in a same deep Nwell of a P-type substrate, and wherein each of the first NVM device and the second NVM device is in a Pwell disposed in the deep Nwell.

9. The memory of claim 1, wherein the first NVM device and the second NVM device comprise silicon-oxide-nitride-oxide-silicon (SONOS), floating gate or FeRAM type NVM devices.

10. The memory of claim 1, wherein the first FET and the second FET are P-channel FETs in a deep Nwell in a P-type substrate, and the first NVM device and the second NVM device comprise N-channel silicon-oxide-nitride-oxide-silicon (SONOS) devices in separate Pwells in the deep Nwell.

11. The memory of claim 10, further comprising an array of flash cells, and a single charge pump integrally formed on a substrate with the array of NVL cells, wherein the charge pump is configured to be used to program and erase both the flash cells and the NVL cells.

12. The memory of claim 1, wherein the first and second field effect FETs comprise weak P-channel metal-oxide-semiconductors (PMOS) transistors having threshold voltages of higher magnitude than the first and second pass gate transistors.

13. A memory comprising:
an array of flash cells;
an array of non-volatile latch (NVL) cells, each NVL cell comprising:
a non-volatile portion including:
a series connected first non-volatile memory (NVM) device and a first pass gate transistor coupled between a first output node and a bitline true, the first pass gate transistor configured to isolate the first NVM device from the first output node when a negative voltage is applied to a gate of the first pass gate transistor; and
a series connected second NVM device and a second pass gate transistor coupled between a second output node and a bitline complement, the second pass gate transistor configured to isolate the second NVM device from the second output node when the negative voltage is applied to a gate of the second pass gate transistor;
a volatile portion including cross-coupled first and second field effect transistors (FET), the first FET coupled between a supply voltage and the first output node, and the second FET coupled between the supply voltage and the second output node, wherein the first FET and the second FET are in a same deep well of a first type disposed in a substrate of a second type, and wherein each of the first NVM device and the second NVM device is in a well of the second type disposed in the deep well; and
a single charge pump configured to be used to program and erase both the flash cells and the NVL cells.

14. The memory of claim 13, wherein each of the first NVM device and second NVM device is in a triple well.

15. The memory of claim 14, wherein gates of the first and the second NVM devices and the triple wells are biased separately from the negative voltage source (VNEG) and a positive voltage source (VPOS) during erase and program operations to enable split voltage operation to program and erase the first and second NVM devices.

16. The memory of claim 14, wherein the first and second pass gate transistors and the first and second NVM devices comprise transistors having channels of the same type, and wherein the first and second FETs comprise channels of a different type.

17. The memory of claim 16, wherein the first FET and the second FET are in a same deep Nwell of a P-type substrate, and wherein each of the first NVM device and the second NVM device is in a Pwell disposed in the deep Nwell.

18. The memory of claim 14, wherein the first FET and the second FET are P-channel FETs in a deep Nwell in a P-type substrate, and the first NVM device and the second NVM device comprise N-channel devices in separate Pwells in the deep Nwell.

19. The NVL cell of claim 18, wherein the first FET and the second FET are weak P-channel FETs having threshold voltages of higher magnitude than the first and second pass gate transistors.

20. A method of programming an array of non-volatile latch (NVL) cells comprising:
providing an array of NVL cells, each including a first non-volatile memory (NVM) device and a first pass gate transistor formed in a PWELL of a triple well and coupled in series between a first output node and a bitline true, a second NVM device and a second pass gate transistor formed in the PWELL and coupled in series between a second output node and a bitline complement, and a volatile latch including cross-coupled first and second field effect transistors coupled between a supply voltage and the output nodes;
isolating the first and second NVM devices in all NVL cells in the array from the output nodes by applying a negative voltage (VNEG) to gates of the first and second pass gate transistors;
applying VNEG to the PWELLs in all NVL cells in the array;
applying VNEG to the bitline true while applying an inhibit voltage (VINH) to the bitline complement in all NVL cells in the array; and
applying a programming voltage (VPOS) to gates of the first and second NVM devices in NVL cells in a selected row of the array while applying VNEG to the first and second NVM devices in NVL cells in a deselected row,
wherein a difference between VPOS and VNEG raises a threshold voltage ($V_{TP}$) of the first NVM devices in NVL cells on the selected row, and the difference between VPOS and VNEG applied to the bitline true is sufficient to program first NVM device in NVL cells on the selected row, and wherein the difference between VPOS and VINH applied to the bitline complement is sufficient to inhibit the second NVM devices in NVL cells on the selected row from getting programmed.

* * * * *